United States Patent
Yao et al.

(10) Patent No.: US 7,859,104 B2
(45) Date of Patent: Dec. 28, 2010

(54) THERMAL INTERFACE MATERIAL HAVING CARBON NANOTUBES AND COMPONENT PACKAGE HAVING THE SAME

(75) Inventors: Yuan Yao, Beijing (CN); Kai-Li Jiang, Beijing (CN)

(73) Assignees: Tsinghua University, Beijing (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 200 days.

(21) Appl. No.: 12/168,845

(22) Filed: Jul. 7, 2008

(65) Prior Publication Data
US 2009/0014864 A1 Jan. 15, 2009

(30) Foreign Application Priority Data
Jul. 13, 2007 (CN) .................. 2007 1 0076011

(51) Int. Cl.
*H01L 23/34* (2006.01)

(52) U.S. Cl. .................. 257/717; 257/706; 257/712; 257/714

(58) Field of Classification Search ......... 257/706–707, 257/713–717; 438/125
See application file for complete search history.

(56) References Cited

U.S. PATENT DOCUMENTS

| | | | |
|---|---|---|---|
| 2006/0131679 A1* | 6/2006 | Hantschel et al. ......... 257/415 |
| 2006/0231946 A1* | 10/2006 | Pan et al. ............. 257/712 |
| 2009/0218681 A1* | 9/2009 | Chrysler et al. ........ 257/713 |

* cited by examiner

*Primary Examiner*—Dung A. Le
(74) *Attorney, Agent, or Firm*—Frank R. Niranjan

(57) ABSTRACT

A thermal interface material includes a carbon nanotube array, a transition structure, and a matrix. The carbon nanotube array includes a plurality of carbon nanotubes. The transition structure covers at least a part of the surfaces of carbon nanotubes. The matrix encompasses the carbon nanotubes. A component package using the thermal interface material includes a die, a heat spreader, and a thermal interface material. The thermal interface material is disposed between the die and the heater spreader.

15 Claims, 5 Drawing Sheets

THERMAL INTERFACE MATERIAL HAVING CARBON NANOTUBES AND COMPONENT PACKAGE HAVING THE SAME

TECHNICAL FIELD

The present invention relates to a thermal interface material, and a component package with the thermal interface material.

BACKGROUND

Electronic components such as semiconductor chips becomes progressively smaller and processes faster with each new product release, while at the same time the heat dissipation requirements increases. Commonly, a thermal interface material is utilized between an electronic component and a heat sink in order to efficiently dissipate heat generated by the electronic component.

Carbon nanotubes have a coefficient of thermal conductivity (about 3000~6000 W/mk) along their longitudinal axis, which is substantially higher than that of other material used for thermal interface materials.

A conventional thermal interface material includes a matrix and a number of carbon nanotubes embedded therein. However, the thermal interface material has a low thermal conductivity, due to the low wetting of carbon nanotubes in the matrix. Therefore, a component package using the thermal interface material has a low thermal conductivity, and cannot efficiently dissipate heat from an electronic component to a heat sink to maintain the circuitry at a desired temperature.

What is desired is, a thermal interface material with good thermal conductivity and a component package that can efficiently dissipate heat.

BRIEF DESCRIPTION OF THE DRAWINGS

The components shown are not necessarily to scale, the emphasis instead being placed upon clearly illustrating the principles of the present method. Moreover, like reference numerals designate corresponding parts throughout the several views.

DETAILED DESCRIPTION OF EXEMPLARY EMBODIMENTS

Generally, in these embodiments, thermal interface material includes a carbon nanotube (CNT) array, and a matrix, and transition structure s. The CNT array can be a super-aligned CNT array and includes a number of CNTs and spaces between the adjacent CNTs. The CNTs are substantially parallel to each other and have substantially equal lengths. The CNTs are uniformly dispersed/embedded in the matrix (i.e., the matrix occupies the spaces in the CNT array and encompasses the CNTs). The matrix can be made of any suitable material, including a high-melting point metal, a low-melting point metal, or an organic compound. The high-melting point metal is selected from a group comprising copper, titanium, alloys thereof and other similar metals. The low-melting point metal is selected from a group comprising indium, mercury, alloys thereof and other similar metals. The transition structures are disposed on at least portions of surfaces of the CNTs. Each of the transition structures includes at least one transition layer. The transition layer is made of a material selected from a group comprising nickel, palladium, chromium, titanium and alloys thereof.

Figure 1:
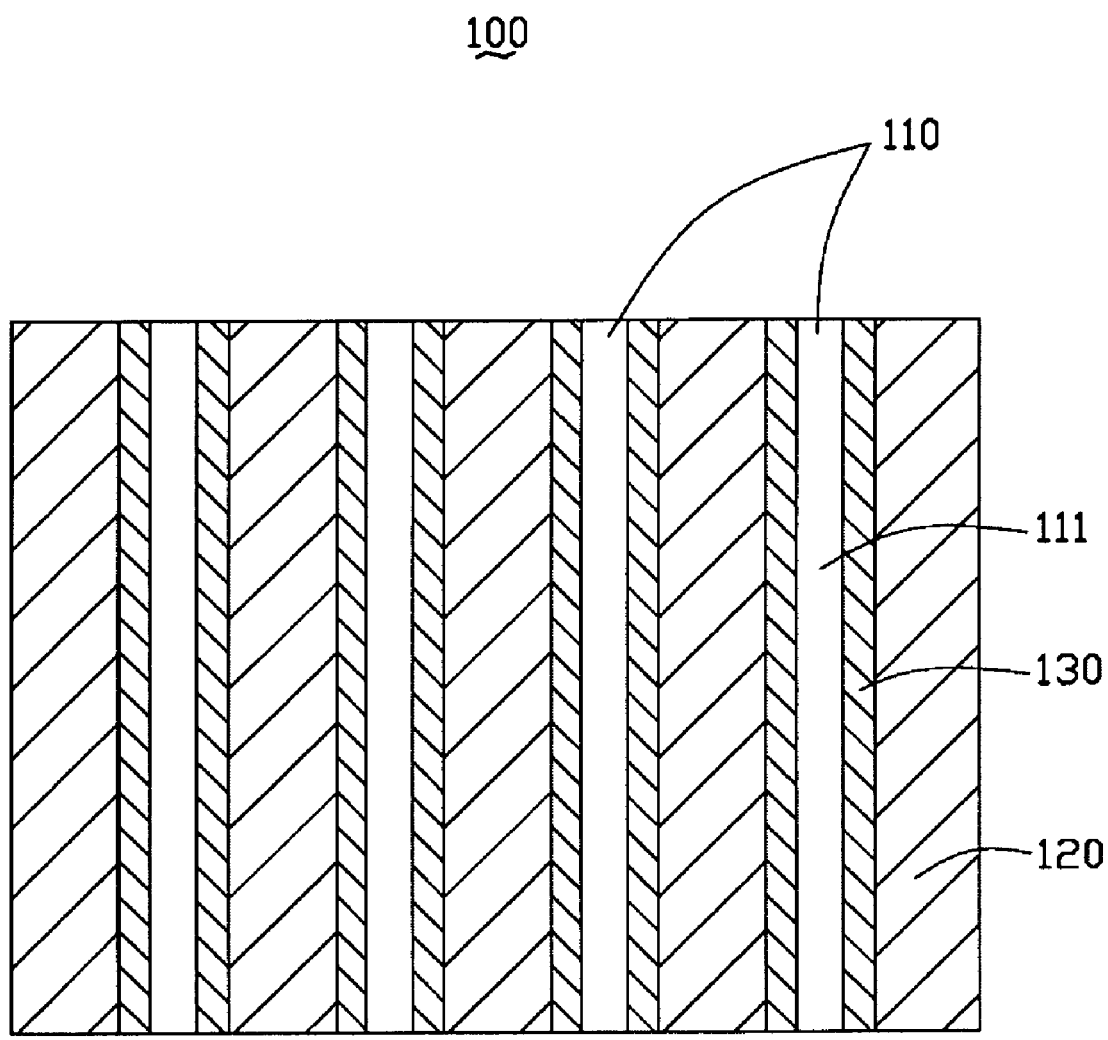
FIG. 1 is a schematic, cross-section view showing a thermal interface material according to a first embodiment.

Referring to FIG. 1, a thermal interface material 100 according to a first embodiment includes a CNT array 110, a matrix 120, and transition structures 130. The CNT array 110 is embedded in the matrix 120, and CNTs 111 of the CNT array 110 are uniformly dispersed therein. A length of the CNTs 111 is substantially equal to the thickness of the matrix 120. Each transition structure 130 is a single-layer structure. The transition structures 130 are disposed between the matrix 120 and the CNTs 111 respectively, and also have a length substantially equal to the thickness of the matrix 120. The longitudinal axes of the CNTs 111 are opportunely perpendicular to two opposite surfaces of the thermal interface material 100.

Figure 2:
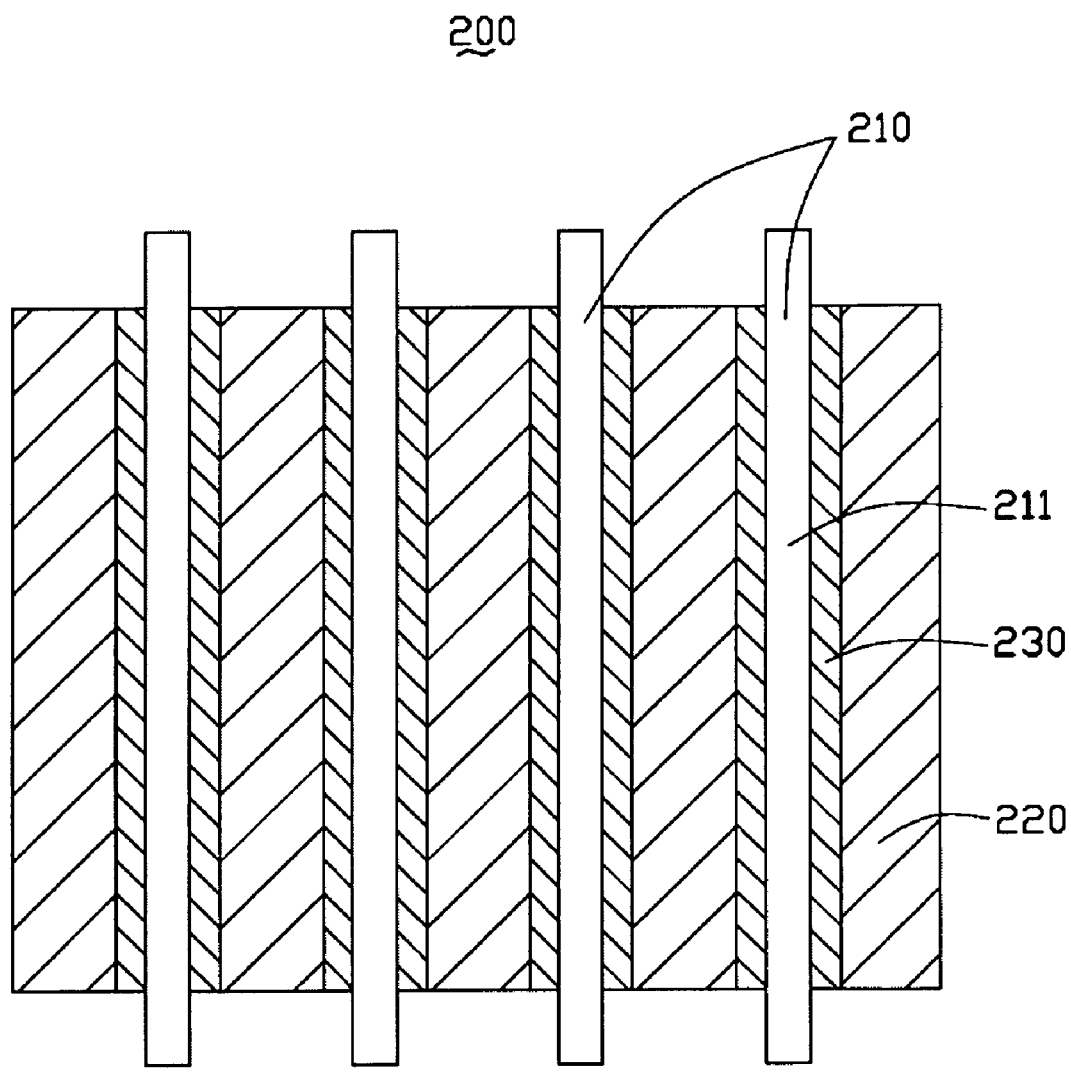
FIG. 2 is a schematic, cross-section view showing a thermal interface material according to a second embodiment.

Referring to FIG. 2, a thermal interface material 200 according to a second embodiment includes a CNT array 210, a matrix 220, and transition structures 230. The thermal interface material 200 is similar to the thermal interface material 100 except that the length of CNTs 211 of the CNT array 210 are larger than the thickness of the matrix 220, and the CNTs 211 are arranged so that two opposite end portions of each CNT 211 extend beyond opposite surfaces of the matrix 220.

Figure 3:
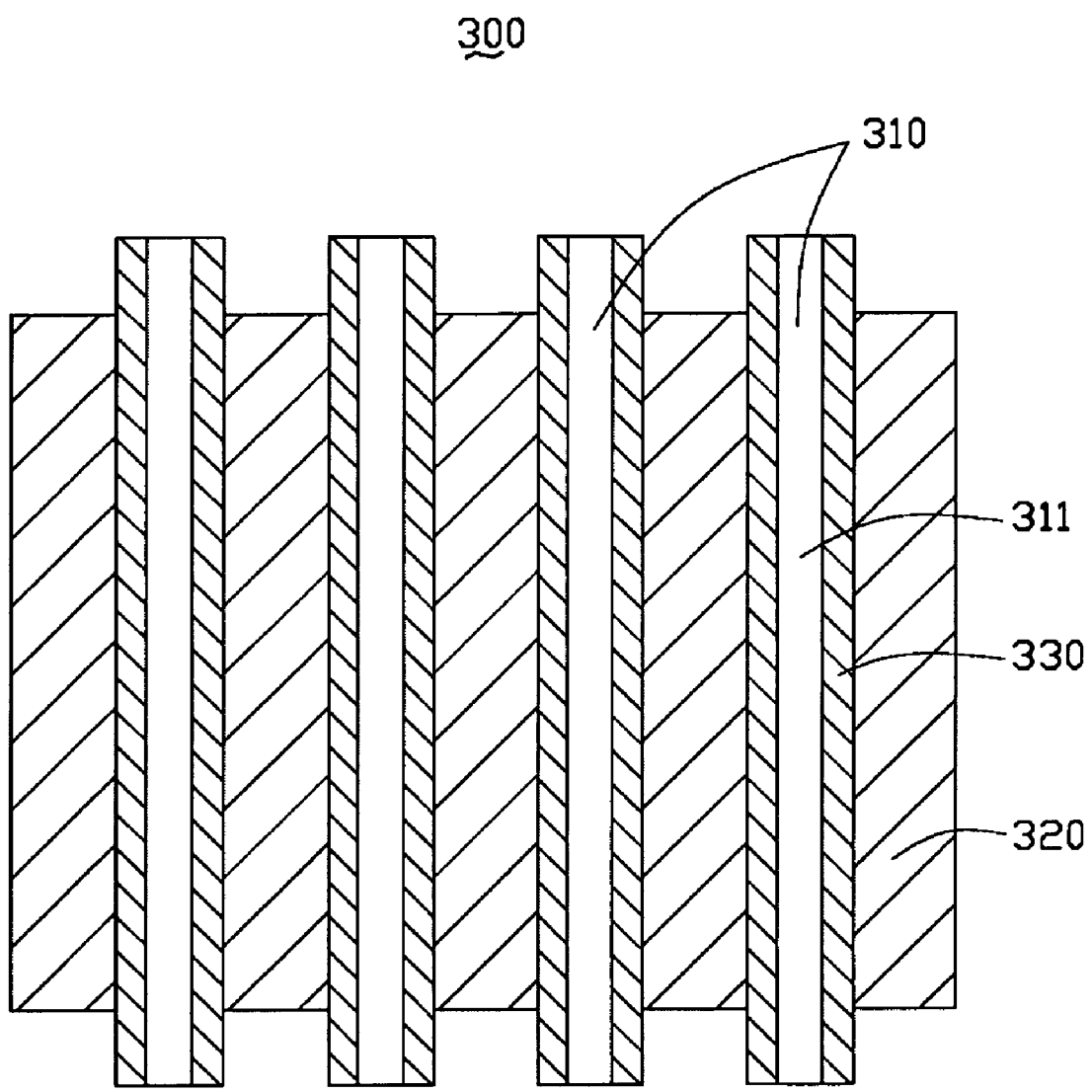
FIG. 3 is a schematic, cross-section view showing a thermal interface material according to a third embodiment.

Referring to FIG. 3, a thermal interface material 300 according to a third embodiment includes a CNT array 310, a matrix 320, and transition structures 330. The thermal interface material 300 is similar to the thermal interface material 200 except that the transition structures 330 are substantially equal in length to the length of CNTs 311 and are correspondingly arranged together with the CNTs 311 as the CNTs 211 in the second embodiment.

Generally, in these embodiments, a component package includes a die, a heat spreader, and a thermal interface materials such as the thermal interface materials 100, 200, or 300 disposed therebetween. The die and the heat spreader are opportunely perpendicular to the longitudinal axes of the CNTs of the thermal matrixs 100, 200, or 300.

Figure 4:
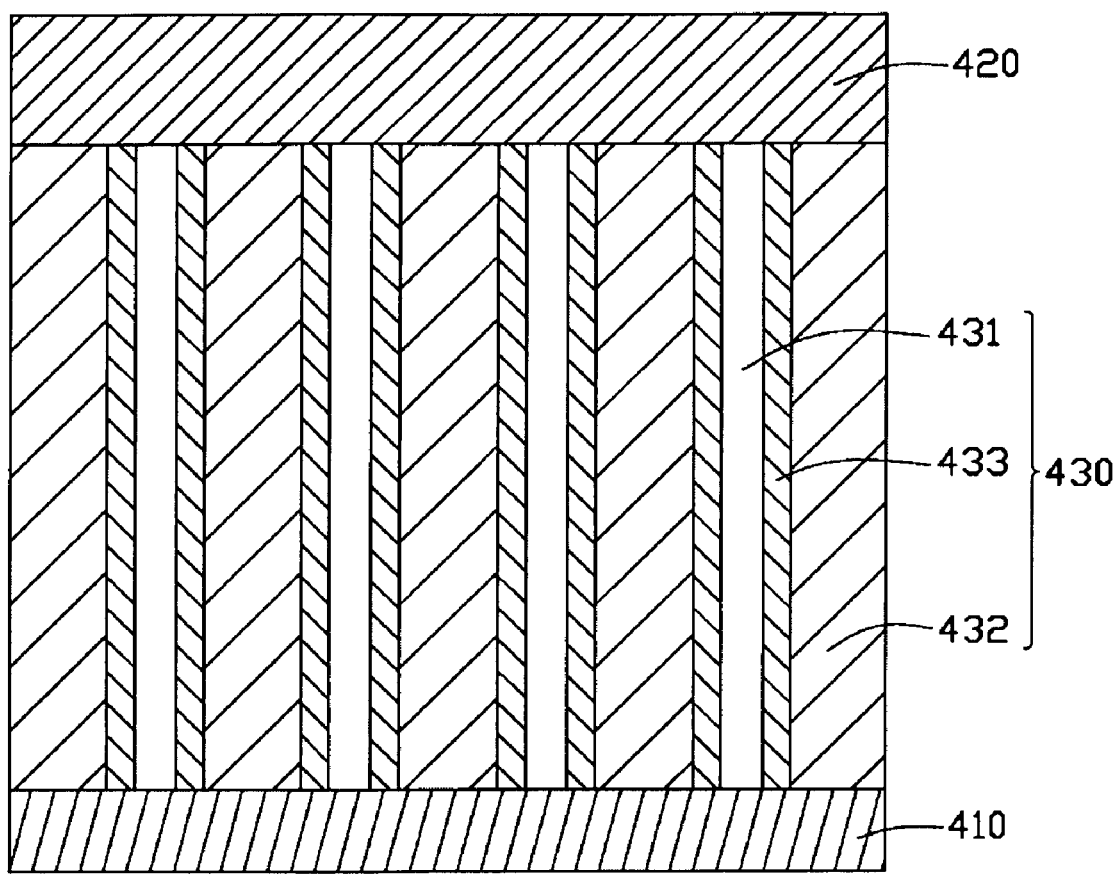
FIG. 4 is a schematic, cross-section view showing a component package according to a forth embodiment.

Referring to FIG. 4, a component package 400 according to a fourth embodiment includes a die 410, a heat spreader 420 and the thermal interface material 430 disposed therebetween. The thermal interface material 430 can be the same as the thermal interface material 100 of the first embodiment, the thermal interface material 200 of the second embodiment, or the thermal interface material 300 of the third embodiment. The thermal interface material 430 includes a matrix 432, a CNT array 431 embedded in the matrix 432, and transition structures 433. The CNT array 431 includes a plurality of CNTs uniformly dispersed therein. The transition structures 433 are disposed between the matrix 432 and the CNTs respectively. The CNT array 431 is disposed on at least one surface of the die 410. The surfaces of the die 410 and the heat spreader 420 are beneficially perpendicular to the longitudinal axes of the CNTs of the CNT array 431. Because the height of the CNTs is substantially equal to the thickness of the matrix 432, a direct, shortest-distance thermal conduction path between the die 410 and the heat spreader 420 is provided.

Figure 5:
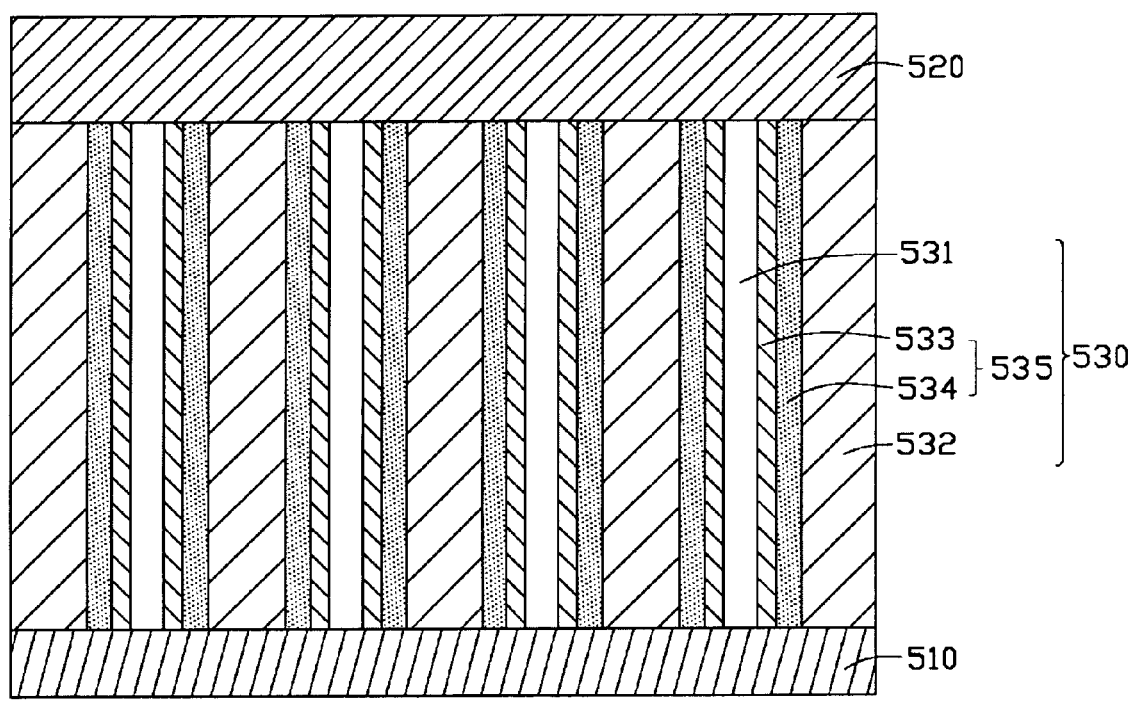
FIG. 5 is a schematic, cross-section view showing a component package according to a fifth embodiment The exemplifications set out herein illustrate at least one preferred embodiment of the invention, in one form, and such exemplifications are not to be construed as limiting the scope of the invention in any manner.

Referring to FIG. 5, a component package 500 according to a fifth embodiment is similar to the component package 400 of the fourth embodiment, and includes a die 510, a heat spreader 520 and a thermal interface material 530 disposed therebetween. The thermal interface material 530 is similar to the thermal interface material 430 but includes double-layer transition structures 535. A CNT array 531 is embedded in the matrix 532, and CNTs of the CNT array 531 are uniformly dispersed therein. The surfaces of the die 510 and the heat spreader 520 are beneficially perpendicular to the longitudinal axes of CNTs of the CNT array 531. The CNTs extend from the matrix 532. Thus, each CNT is adequately in contact with and attach to the die 510 and the heat spreader 520. Each of the transition structures 535 includes a first transition layer 533 and a second transition layer 534. The first layer 533 can be made of palladium, and the second transition layer 534 can be made of nickel. The transition structures are coated on the surfaces of the CNT array 531.

A method for making the component package includes the following steps: depositing a CNT array on a surface of a die, the CNT array including a number of CNTs, each CNT including a first end portion and a second end portion opposite thereto, and the first end portions of CNTs are attached to the die;
depositing a transition structure on the surfaces of CNTs; inserting a matrix into the CNT array; and
attaching a heat spreader to the second end portions of CNTs, and thereby achieving a component package.

The CNT array is deposited by any suitable process, exemplarily, chemical vapor deposition, thermal deposition, electron-beam deposition, or sputtering. The transition structure and the matrix are deposited by any suitable processes, for example, chemical vapor deposition, thermal deposition, electron-beam deposition, sputtering, or plating. The heat spreader can be attached to the second end portion of CNTs by bolding or pasting. If desired, after inserting the matrix, an etching step may be utilized to make at least one end portion of CNTs extending from the matrix.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A thermal interface material comprising:
a carbon nanotube array comprising a plurality of carbon nanotubes, spaces being defined between adjacent carbon nanotubes;
a transition structure covering an entire peripheral surface of each of the carbon nanotubes; and
a matrix occupying the spaces and encompassing the carbon nanotubes with each transition structure disposed between the matrix and a corresponding one of the carbon nanotubes;
wherein each of the carbon nanotubes has a length substantially equal to a thickness of the matrix, and each transition structure has a length substantially equal to the thickness of the matrix.

2. The thermal interface material as claimed in claim 1, wherein the carbon nanotube array is a super-aligned carbon nanotube array, and the carbon nanotubes are parallel to each other.

3. The thermal interface material as claimed in claim 1, wherein the matrix is comprised of a high-melting point metal, a low-melting point metal and an organic compound.

4. The thermal interface material as claimed in claim 3, wherein the high-melting point metal is selected from the group consisting of copper, titanium, a copper alloy and a titanium alloy.

5. The thermal interface material as claimed in claim 3, wherein the low-melting point metal is selected from the group consisting of indium, mercury, indium alloy and mercury alloy.

6. The thermal interface material as claimed in claim 1, wherein the transition structure comprises a first transition layer around the peripheral surface of the carbon nanotube and a second transition layer around the first transition layer.

7. The thermal interface material as claimed in claim 6, wherein the transition layer is made of a material selected from the group consisting of nickel, palladium, chromium, titanium, nickel alloy, palladium alloy, chromium alloy, and titanium alloy.

8. A component package comprising:
a die;
a heat spreader; and
a thermal interface material disposed between the die and the heater spreader, comprising:
a carbon nanotube array comprising a plurality of carbon nanotubes, spaces being defined between adjacent carbon nanotubes;
a transition structure covering an entire peripheral surface of each of the carbon nanotubes; and
a matrix occupying the spaces and encompassing the carbon nanotubes with each transition structure disposed between the matrix and a corresponding one of the carbon nanotubes;
wherein each of the carbon nanotubes has a length substantially equal to a thickness of the matrix, and each transition structure has a length substantially equal to the thickness of the matrix.

9. The component package as claimed in claim 8, wherein the die and the heat spreader are perpendicular to the longitudinal axes of the carbon nanotubes.

10. The component package as claimed in claim 8, wherein the carbon nanotube array is a super-aligned carbon nanotube array, and the carbon nanotubes are parallel to each other.

11. The component package as claimed in claim 8, wherein the matrix is comprised of a high-melting point metal, a low-melting point metal and an organic compound.

12. The component package as claimed in claim 11, wherein the high-melting point metal is selected from the group consisting of copper, titanium, a copper alloy and a titanium alloy.

13. The component package as claimed in claim 11, wherein the low-melting point metal is selected from the group consisting of indium, mercury, indium alloy and mercury alloy.

14. The component package as claimed in claim 8, wherein the transition structure comprises a first transition layer around the peripheral surface of the carbon nanotube and a second transition layer around the first transition layer.

15. The component package as claimed in claim 8, wherein the transition layer is made of a material selected from the group consisting of nickel, palladium, chromium, titanium, nickel alloy, palladium alloy, chromium alloy, and titanium alloy.

* * * * *